United States Patent
Choi

(10) Patent No.: US 11,195,957 B2
(45) Date of Patent: Dec. 7, 2021

(54) SCHOTTKY BARRIER DIODE

(71) Applicant: Silicon Works Co., Ltd., Daejeon (KR)

(72) Inventor: Kee Joon Choi, Daejeon (KR)

(73) Assignee: Silicon Works Co., Ltd., Daejeon (KR)

( * ) Notice: Subject to any disclaimer, the term of this patent is extended or adjusted under 35 U.S.C. 154(b) by 0 days.

(21) Appl. No.: 16/939,494

(22) Filed: Jul. 27, 2020

(65) Prior Publication Data

US 2021/0036164 A1  Feb. 4, 2021

(30) Foreign Application Priority Data

Jul. 29, 2019  (KR) .......... 10-2019-0091821

(51) Int. Cl.
*H01L 29/872* (2006.01)
*H01L 29/06* (2006.01)

(52) U.S. Cl.
CPC ........ *H01L 29/872* (2013.01); *H01L 29/0623* (2013.01); *H01L 29/0634* (2013.01)

(58) Field of Classification Search
None
See application file for complete search history.

(56) References Cited

U.S. PATENT DOCUMENTS

2021/0036164 A1*  2/2021  Choi ................. H01L 29/872

FOREIGN PATENT DOCUMENTS

| JP | 2009-032909 B2 | 2/2009 |
| KR | 10-0628421 B1 | 9/2006 |
| KR | 10-0662691 B1 | 1/2007 |
| KR | 10-0701140 B1 | 3/2007 |

* cited by examiner

*Primary Examiner* — Jack S Chen
(74) *Attorney, Agent, or Firm* — Polsinelli PC

(57) ABSTRACT

Disclosed is a Schottky barrier diode which may be applied to an application that requires a low off current (Ioff), such as a mobile integrated circuit. The Schottky barrier diode can improve a blocking characteristic for a backward current flow while maintaining an advantage of a turn-on current, by improving the structure of a contact surface that is pinched off by depletion.

8 Claims, 2 Drawing Sheets

SCHOTTKY BARRIER DIODE

BACKGROUND

1. Technical Field

The present disclosure relates to a Schottky barrier diode, and more particularly, to a Schottky barrier diode which may be applied to an application that requires a low off current (Ioff), such as a mobile integrated circuit.

2. Related Art

A Schottky barrier diode is a device using, as a rectification action, a potential barrier generated by a contact between a barrier metal and a semiconductor. The Schottky barrier diode is used in high-speed switching or the conversion, detection, etc. of a high frequency.

The Schottky barrier diode is turned on by multiple carriers of an epitaxial semiconductor layer moving to the barrier metal when a forward current flows into the Schottky barrier diode. In this case, a voltage-current characteristic depends on a Schottky characteristic.

Furthermore, if a backward current is to flow into the Schottky barrier diode, the Schottky barrier diode is turned off by a potential barrier between the barrier metal and the semiconductor. The Schottky barrier diode is turned off by a junction barrier formed as a P well region is depleted as an N well region.

In order to apply the Schottky barrier diode to an application that requires fast turn-off and a low off current (Ioff), the Schottky barrier diode requires a structure capable of improving the off current (Ioff) while maintaining an advantage of a turn-on current (Ion) without any change.

SUMMARY

Various embodiments are directed to the provision of a Schottky barrier diode having an improved off current characteristic while maintaining an advantage of a turn-on current.

Also, various embodiments are directed to the provision of a Schottky barrier diode having an improved off current characteristic by forming a semiconductor region, in which a junction barrier is formed by depletion, so that widths in a first direction and second direction perpendicular to each other have the same length.

In an embodiment, a Schottky barrier diode includes a barrier metal layer and a semiconductor substrate configured to form a Schottky contact with the barrier metal layer. The semiconductor substrate includes a first semiconductor region configured to form a first contact surface brought into contact with the barrier metal layer and second semiconductor regions distributed at a plurality of locations, respectively, within the first contact surface and configured to form respective second contact surfaces brought into contact with the barrier metal layer. The first semiconductor region has an insulating characteristic with respect to a backward current flow from the semiconductor substrate to the barrier metal layer. Each of the second contact surfaces is formed to have widths having the same length in a first direction and second direction perpendicular to each other. The first semiconductor region is depleted into the second semiconductor regions by the backward current flow to block the backward current flow through the second semiconductor regions.

DETAILED DESCRIPTION

Figure 1:
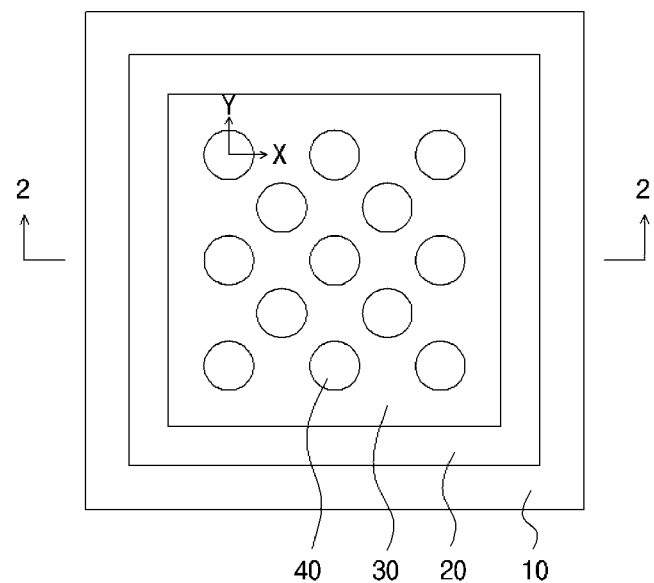
FIG. 1 is a plan view of a Schottky barrier diode according to an embodiment.

Exemplary embodiments will be described below in detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

A Schottky barrier diode according to an embodiment will be described below with reference to FIGS. 1 to 3.

FIG. 1 is a plan layout of a Schottky barrier diode according to an embodiment, and illustrates the state in which a barrier metal layer BM and an anode electrode AN have not been formed. Furthermore, FIGS. 2 and 3 are partial sectional views taken along line 2-2 in FIG. 1. The Schottky barrier diode includes a semiconductor substrate SM, the barrier metal layer BM and anode electrode AN on one side of the semiconductor substrate SM, and a cathode electrode CA on the other side of the semiconductor substrate SM.

The anode electrode AN, the cathode electrode CA and the barrier metal layer BM include a conductive material, and may be formed to have thicknesses designed by a manufacturer. Among the elements, the barrier metal layer BM may be formed to include a metal material, such as titanium (Ti) or a Ti alloy, silicide or cobalt silicide.

A contact region with which the barrier metal layer BM will come into contact is defined in the semiconductor substrate SM by a guard ring 10. The contact region may be understood as an internal region of the guard ring 10.

FIG. 1 illustrates that the guard ring 10 is formed in a quadrangle, for example. An isolation region 20 is formed along the guard ring 10 within the guard ring 10. The guard ring 10 and the isolation region 20 may be understood as a trench formed in one side of the semiconductor substrate SM and filled with an insulating substance. Among the elements, the guard ring 10 may be understood as being formed for electrical separation between the internal region and external region of the guard ring 10. The isolation region 20 may be understood as being accessorily formed for isolation.

Figure 2:
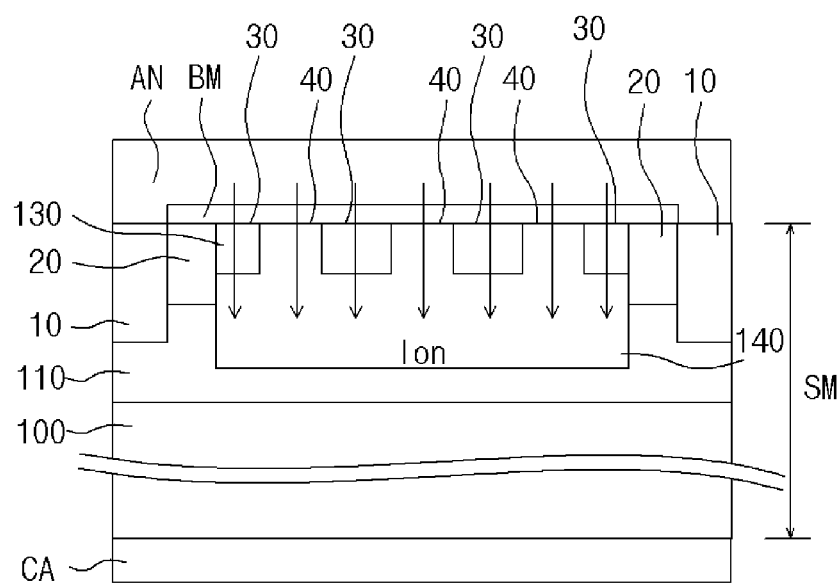
FIG. 2 is a partial sectional view taken along 2-2 in FIG. 1 for describing a forward current flow.
Figure 3:
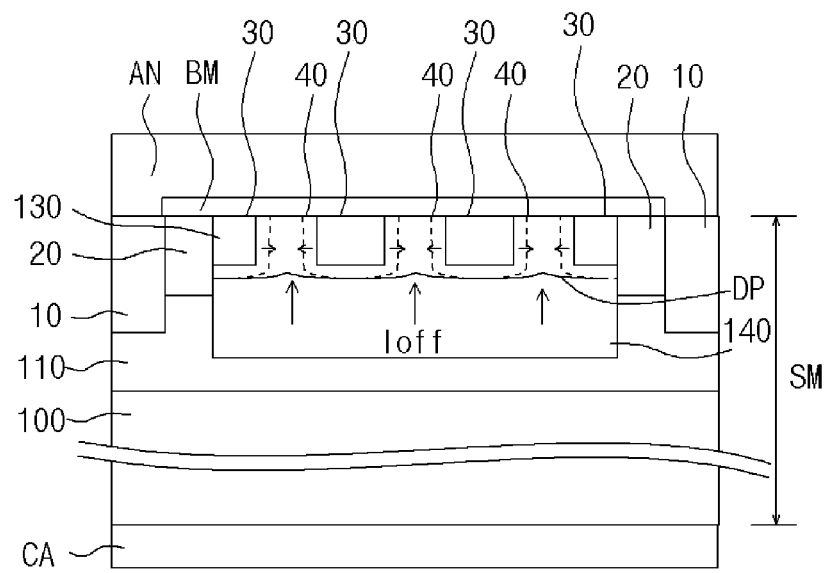
FIG. 3 is a partial sectional view taken along 2-2 in FIG. 1 for describing a backward current flow.

As illustrated in FIGS. 2 and 3, the barrier metal layer BM is formed over the contact region defined by the guard ring 10. The anode electrode AN is formed over the barrier metal layer BM.

Furthermore, referring to FIG. 1, a first contact surface 30 and second contact surfaces 40 are formed within the contact region of the guard ring 10.

The first contact surface 30 is formed in a rectangle within the guard ring 10. The second contact surfaces 40 are distributed at a plurality of locations within the first contact surface 30. Each of the second contact surfaces 40 has widths having the same length in a first direction (e.g., X in FIG. 1) and second direction (e.g., Y in FIG. 1) that are perpendicular to each other. For example, each of the second contact surfaces is illustrated as a circle.

Referring to FIGS. 2 and 3, the first contact surface 30 may be understood as an upper surface formed by a first semiconductor region of the internal region of the guard ring 10. The second contact surfaces 40 may be understood as an upper surface formed by a second semiconductor region of the internal region of the guard ring 10.

The first semiconductor region may be formed using a P type semiconductor. For example, the first semiconductor region may be formed by a P well 130. The second semiconductor region may be formed using an N type semiconductor. For example, the second semiconductor region may be formed by an N well 140. Hereinafter, the first semiconductor region is referred to as the P well 130, and the second semiconductor region is referred to as the N well 140.

The P well 130 is formed to have a first depth. The N well 140 is formed to have a depth equal to or larger than the first depth. FIGS. 2 and 3 illustrate that the N well 140 is formed as a lower well and the P well 130 is formed as an upper well.

The structure of the semiconductor substrate SM is described with reference to FIGS. 2 and 3.

The semiconductor substrate SM includes a sublayer 100 and an epitaxial layer 110. The sublayer 100 may be formed using an N+ type semiconductor, for example. The epitaxial layer 110 may be formed using an N− type semiconductor, for example. The epitaxial layer 110 is formed on the sublayer 100. The cathode electrode CA is formed below the sublayer 100, that is, on the other side of the semiconductor substrate SM.

The N well 140 is formed in the epitaxial layer 110 as the lower well. The P wells 130 are formed over the N well 140 as the upper wells. In this case, the N well 140 may be formed as a high voltage N well. The amount of impurities may be determined by considering the epitaxial layer 110 and the sublayer 100.

The second contact surfaces 40 formed by the N well 140 are spaced apart from each other, and are formed to include multiple columns within the first contact surface 30. Furthermore, the second contact surfaces 40 of adjacent columns are disposed to go crisscross. Accordingly, the second contact surfaces 40 may be uniformly distributed in the first contact surface 30.

As the Schottky barrier diode according to an embodiment is implemented as described above, a forward current flow can be guaranteed as in FIG. 2, and a backward current flow can be effectively blocked as in FIG. 3.

More specifically, the P well 130 forming the first contact surface 30 and the N well 140 forming the second contact surfaces 40 has a Schottky characteristic according to a Schottky contact with respect to a forward current flow from the barrier metal layer BM to the semiconductor substrate SM. As a result, as in FIG. 2, the forward current flow, that is, a flow of a turn-on current (Ion) is guaranteed.

The P well 130 has an insulating characteristic with respect to a backward current flow from the semiconductor substrate SM to the barrier metal layer BM.

Furthermore, the P well 130 forms a depletion region DP extended to the region of the N well 140, that is, the second contact surfaces 40, by the backward current flow. The depletion region DP of the P well 130 is gradually grown by the backward current flow. As a result, the second contact surfaces 40 formed by the N well 140 are pinched off by the depletion region DP. The depletion region DP forms a junction barrier. As a result, the backward current flow through the second contact surfaces 40 is blocked. That is, a turn-off current (Ioff), that is, a backward current, is blocked.

Each of the second contact surfaces 40 according to an embodiment is formed in a circle. Accordingly, the depletion region DP by the growth of the P well 130 can be uniformly grown on all the sides of the second contact surfaces 40. The second contact surfaces 40 can be efficiently pinched off by the growth of the depletion region DP.

Accordingly, the embodiments of FIGS. 1 to 3 can improve a characteristic in which pinch-off is formed because each of the second contact surfaces 40 having the depletion region formed therein is formed in a circle having widths having the same length in the first direction and second direction perpendicular to each other. As a result, the Schottky barrier diode can improve a blocking characteristic for the backward current flow while maintaining an advantage of the turn-on current, and can have an improved off current characteristic.

Figure 4:
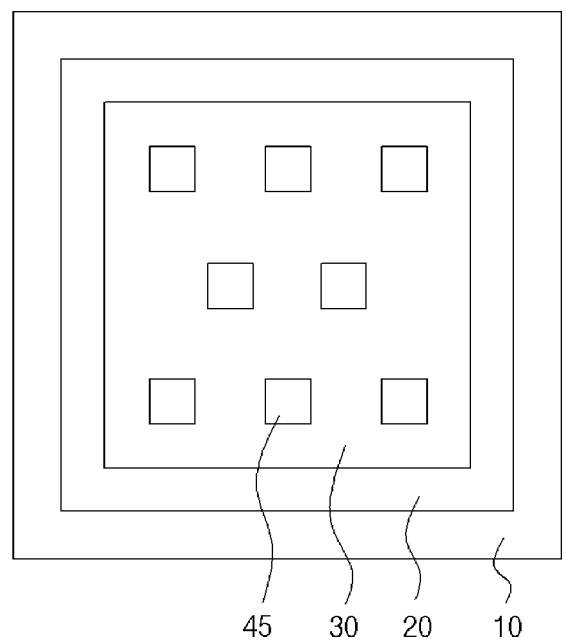
FIG. 4 is a plan view of a Schottky barrier diode according to another embodiment.

According to an embodiment, as in FIG. 4, each of second contact surfaces 45 may be formed in a square. The embodiment of FIG. 4 is configured in the same manner as that of FIG. 1 except the shapes of the second contact surfaces 45, and thus a redundant description thereof is omitted.

Each of the second contact surfaces 45 is formed in a square, that is, one of figures, each one having widths having the same length in the first direction and second direction perpendicular to each other.

Accordingly, the depletion region DP of the P well 130 is grown at a uniform speed in four surfaces by the backward current flow. As a result, the second contact surfaces 45 formed by the N well 140 can be efficiently pinched off by the depletion region DP. A backward current flow through the second contact surfaces 45 can be effectively blocked.

That is, the embodiment of FIG. 4 can also improve a characteristic in which pinch-off is formed because each of the second contact surfaces 45 having the depletion region formed therein is formed in a square, that is, one example of figures each having widths having the same length in the first direction and second direction perpendicular to each other. As a result, the Schottky barrier diode can improve a blocking characteristic for the backward current flow while maintaining an advantage of the turn-on current, and can have an improved off current characteristic.

Each of the second contact surfaces 45 may be configured in a regular octagon having widths having the same length in the first direction and second direction perpendicular to each other, among regular polygons, in addition to the circle illustrated in FIG. 1 and the square illustrated in FIG. 4.

That is, the Schottky barrier diode according to an embodiment can be applied to an application that requires fast turn-off and a low off current (Ioff), such as a mobile integrated circuit.

The present disclosure can improve a blocking characteristic for a backward current flow while maintaining an advantage of a turn-on current by improving a semiconductor region in which a depletion region is formed.

Furthermore, the present disclosure has an advantage in that it has an improved off current characteristic because each of the semiconductor regions forming a junction barrier by depletion has widths having the same length in the first direction and second direction perpendicular to each other.

While various embodiments have been described above, it will be understood to those skilled in the art that the embodiments described are by way of example only. Accordingly, the disclosure described herein should not be limited based on the described embodiments.

What is claimed is:

1. A Schottky barrier diode comprising:
   a barrier metal layer; and a semiconductor substrate configured to form a Schottky contact with the barrier metal layer, wherein the semiconductor substrate comprises:

a first semiconductor region configured to form a first contact surface brought into contact with the barrier metal layer; and second semiconductor regions distributed at a plurality of locations, respectively, within the first contact surface and configured to form respective second contact surfaces brought into contact with the barrier metal layer, the first semiconductor region has an insulating characteristic with respect to a backward current flow from the semiconductor substrate to the barrier metal layer;

each of the second contact surfaces is formed to have widths having an identical length in a first direction and second direction perpendicular to each other; and the first semiconductor region is depleted into the second semiconductor regions by the backward current flow to block the backward current flow through the second semiconductor regions.

2. The Schottky barrier diode of claim 1, wherein:

an anode electrode is formed over the barrier metal layer, and the first semiconductor region and the second semiconductor regions have a Schottky characteristic for a forward current flow from the barrier metal layer to the semiconductor substrate.

3. The Schottky barrier diode of claim 1, wherein:

the first semiconductor region is formed using a P type semiconductor, and the second semiconductor regions are formed using an N type semiconductor.

4. The Schottky barrier diode of claim 1, wherein:

the first semiconductor region is formed by a P well having a first depth, and the second semiconductor regions are formed by an N well equal to or larger than the first depth.

5. The Schottky barrier diode of claim 4, wherein the N well is formed as a high voltage N well.

6. The Schottky barrier diode of claim 1, wherein each of the second contact surfaces is formed in a circle.

7. The Schottky barrier diode of claim 1, wherein each of the second contact surfaces is formed in a square.

8. The Schottky barrier diode of claim 1, wherein:

the second contact surfaces are is formed to have multiple columns within the first contact surface, and the second contact surfaces of adjacent columns are disposed to go crisscross.

\* \* \* \* \*